US010537036B2

(12) United States Patent
Abe

(10) Patent No.: US 10,537,036 B2
(45) Date of Patent: Jan. 14, 2020

(54) ACCESSORY HOLDER FOR AN ELECTRONIC DEVICE, AND PRINTER

(71) Applicant: SEIKO EPSON CORPORATION, Tokyo (JP)

(72) Inventor: Tsukasa Abe, Asahi-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/595,058

(22) Filed: May 15, 2017

(65) Prior Publication Data

US 2017/0339796 A1 Nov. 23, 2017

(30) Foreign Application Priority Data

May 17, 2016 (JP) .................................. 2016-098477

(51) Int. Cl.
*H05K 5/02* (2006.01)
*B41J 29/02* (2006.01)

(52) U.S. Cl.
CPC ......... *H05K 5/0247* (2013.01); *H05K 5/0234* (2013.01); *B41J 29/02* (2013.01)

(58) Field of Classification Search
CPC ......... B41J 29/02; B41J 29/13; H05K 5/0234; H05K 5/0247
See application file for complete search history.

(56) References Cited

U.S. PATENT DOCUMENTS

| 4,732,502 A * | 3/1988 | Yokoi ...................... B41J 29/02 400/328 |
| 6,304,428 B1 * | 10/2001 | Sato ......................... B41J 29/02 312/223.2 |
| 2008/0008516 A1 * | 1/2008 | Bryant ....................... B41J 3/36 400/625 |
| 2011/0068043 A1 | 3/2011 | Kano |

FOREIGN PATENT DOCUMENTS

| JP | 2001-180959 | 7/2001 |
| JP | 2014-96983 | 5/2014 |

* cited by examiner

*Primary Examiner* — James Wu
(74) *Attorney, Agent, or Firm* — Workman Nydegger

(57) ABSTRACT

An electronic device having an accessory device such as an AC adapter is constructed so that the part that holds the accessory device is not a dedicated part of the electronic device and allows the easy dissipation of heat. The electronic device has an installation member configured to attach an accessory device to the part of the electronic device that is the bottom when the electronic device is in place for use; and a support member configured discretely from the installation member, and supporting the electronic device on the installation surface when the electronic device is installed for use.

6 Claims, 8 Drawing Sheets

ACCESSORY HOLDER FOR AN ELECTRONIC DEVICE, AND PRINTER

BACKGROUND

1. Technical Field

The present invention relates to an electronic device having an accessory device such as an AC adapter, and relates more particularly to an electronic device of which the part that holds the accessory device is not a dedicated part of the electronic device, and is constructed to dissipate heat easily.

2. Related Art

An AC adapter unit configured to compactly hold an AC adapter and DC cable so that radiation noise from the DC cable is not amplified, a storage tray for the AC adapter, and an electronic device unit are described in JP-A-2014-96983.

However, because the storage tray (outside case) of the AC adapter described in JP-A-2014-96983 is also the bottom of the electronic device (the part forming the bottom when the electronic device is in use), the size of the storage tray must be matched to the external dimensions of the electronic device. The dimensions and shape of the storage tray must therefore be adapted to the model of the electronic device or the shape of the AC adapter installed therein, and the storage tray must be manufactured as a dedicated part for the electronic device. Furthermore, because the storage tray covers the entire bottom of the electronic device, it inhibits dissipation of heat from the electronic device.

SUMMARY

An objective of the present invention is to provide an electronic device having an accessory device such as an AC adapter, and constructed so that the part that holds the accessory device is not a dedicated part of the electronic device and allows heat to dissipate easily.

To achieve the foregoing objective, one aspect of the invention is an electronic device including: an installation member configured to attach an accessory device to the part of the electronic device that is the bottom when the electronic device is in use; and a support member configured discretely from the installation member, and supporting the electronic device on the installation surface when the electronic device is installed for use.

Thus comprised, the installation member for installing an accessory device can be used as a common component shared by different models of the electronic device regardless of the shape and size of the electronic device if the accessory device is the same.

Because the accessory device is installed using an installation member, the member that supports the electronic device, and the members forming the outside case of the electronic device do not need the ability to attach the accessory device, an opening can be formed in the bottom of the electronic device, and heat can therefore be dissipated easily.

Preferably, in another aspect of the invention, the support member is configured so that the installed accessory device cannot be seen when the electronic device is installed for use.

This configuration provides a nice appearance even when the accessory device is attached to the bottom of the electronic device.

Preferably, in another aspect of the invention, the support member has a plurality of pedestal members that support the electronic device.

Thus comprised, a large opening can be formed in the bottom of the electronic device, further improving heat dissipation.

Further preferably in another aspect of the invention, the support member has an opening to the bottom when the electronic device is installed for use.

This configuration enables the electronic device to dissipate heat easily.

Preferably, in another aspect of the invention, the outside dimensions of the support member are substantially the same as the outside dimensions of the bottom of the electronic device.

This configuration makes designing the support member simple while affording a good appearance because it is only necessary to adjust the support member to the size of the electronic device.

Preferably, in another aspect of the invention, the installation member is configured from multiple discrete parts.

By configuring the installation member from multiple discreet parts, the size of the parts required to fasten the accessory device can be reduced, and the weight of the electronic device can be reduced.

Preferably, in another aspect of the invention, the multiple discrete parts of the installation member are identically shaped.

This configuration enables parts to be shared between multiple devices.

To achieve the foregoing objective, another aspect of the invention is a printer including an installation member configured to attach an accessory device to the part of the printer that is the bottom when the printer is in use; and a support member configured discretely from the installation member, and supporting the printer on the installation surface when the printer is installed for use.

Thus comprised, the installation member for installing an accessory device can be used as a common component shared by other printers regardless of the shape and size of the printer if the accessory device is the same.

Because the accessory device is installed using an installation member, the member that supports the printer, and the members forming the outside case of the printer do not need the ability to attach the accessory device, an opening can be formed in the bottom of the printer, and heat can therefore be dissipated easily.

Other objects and attainments together with a fuller understanding of the invention will become apparent and appreciated by referring to the following description and claims taken in conjunction with the accompanying drawings.

DESCRIPTION OF EMBODIMENTS

Figure 1:
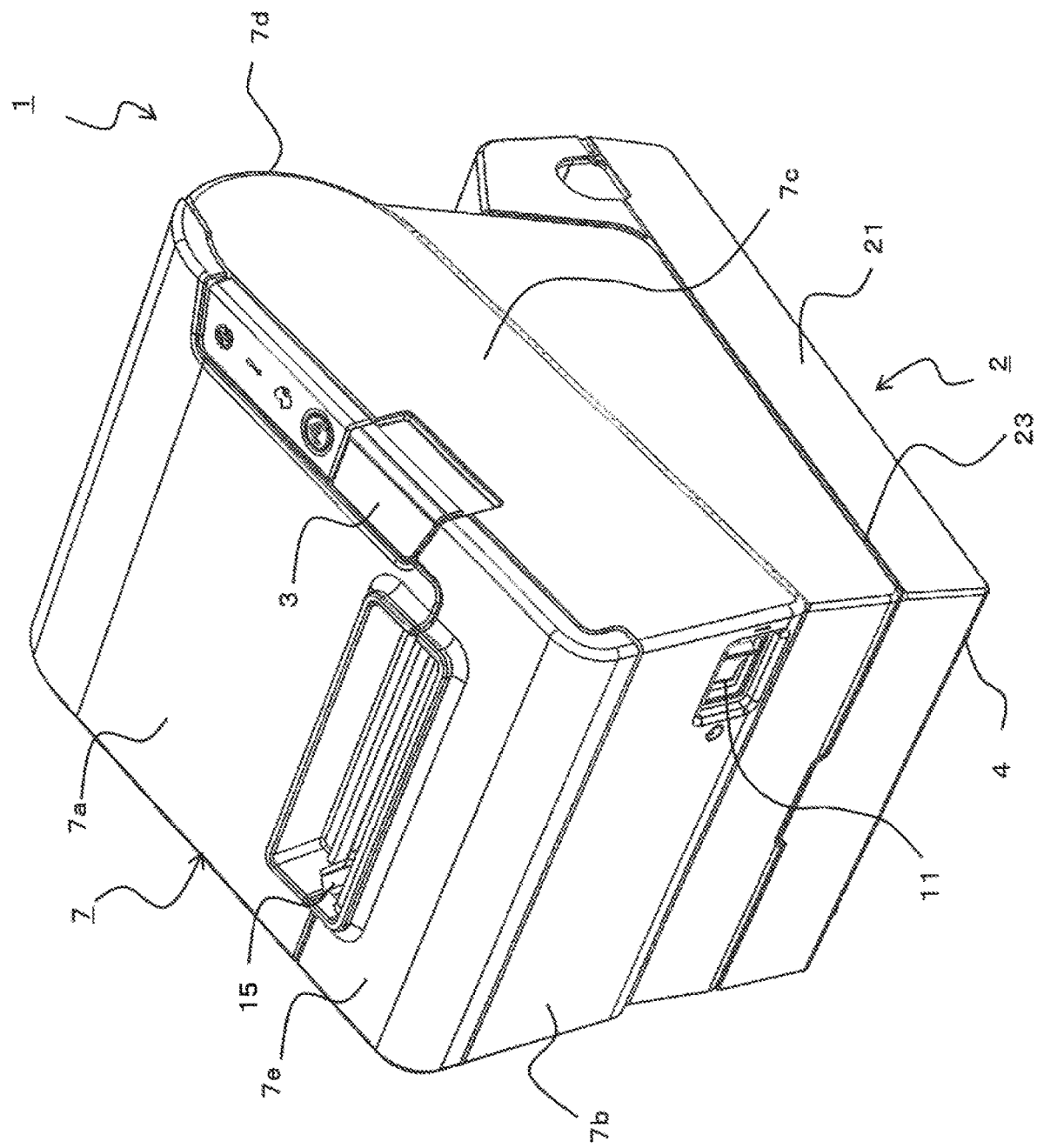
FIG. 1 is an external oblique view of a printer 1 according to a first embodiment of the invention.

Preferred embodiments of the present invention are described below with reference to the accompanying figures. However, the embodiments described below do not limit the technical scope of the invention. Note that in the figures like or similar parts are identified by the same reference numerals or reference symbols.

Figure 7:
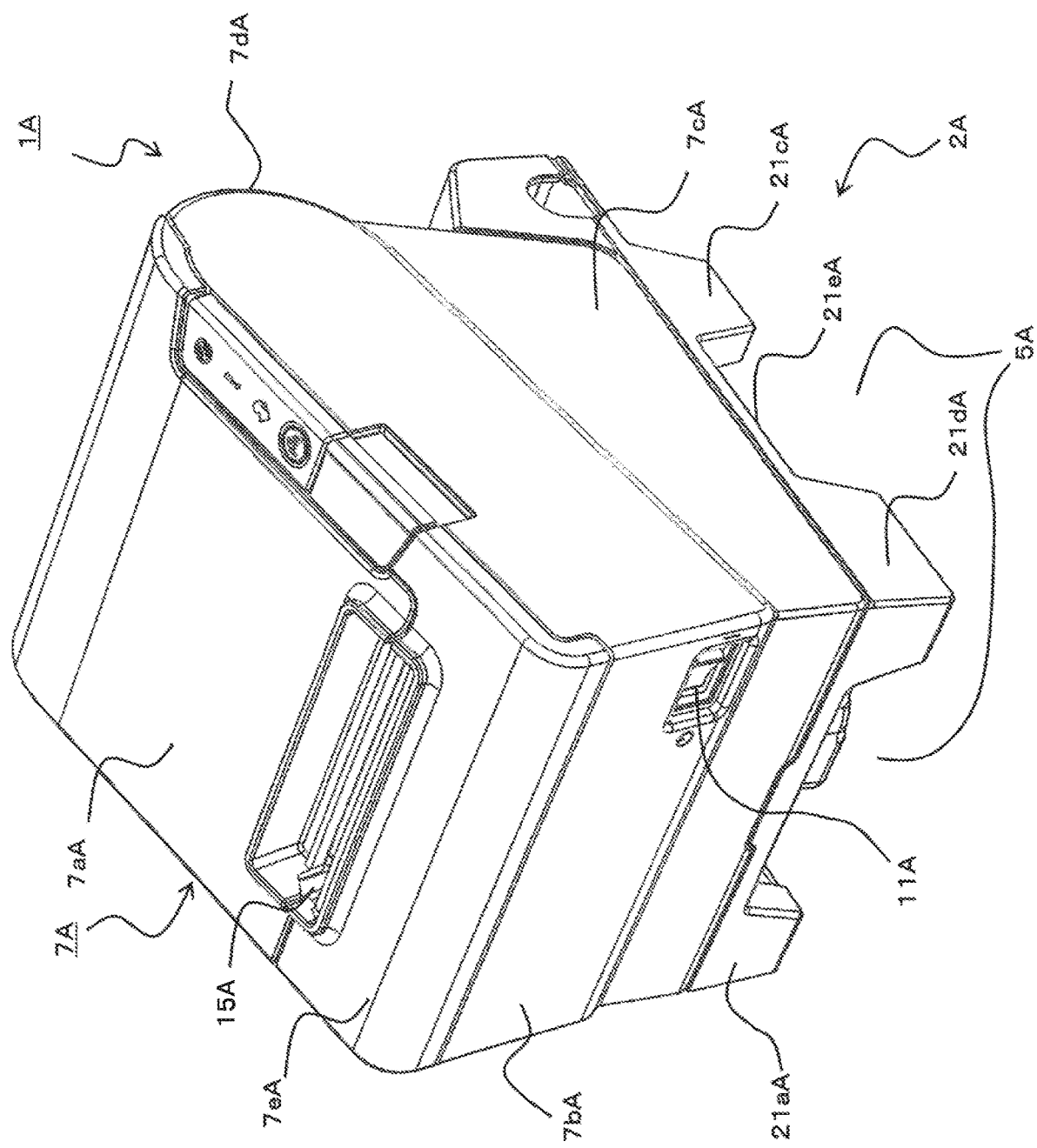
FIG. 7 is an external oblique view of a printer 1 according to a second embodiment of the invention.

FIG. 1 and FIG. 7 are external oblique views of a first and second embodiment, respectively, of a printer as an example of an electronic device according to the invention. In FIG. 1 and FIG. 7, printer 1 and printer 1A are printing devices employing the invention, and respectively have on the bottom thereof an AC adapter 13, 13A as an example of an accessory device.

Disposed to the bottoms 4, 4A of the printers 1, 1A are installation members 12*a*, 12*b* and 12*a*A, 12*b*A for installing an AC adapter 13, 13A; and support members 2, 2A that support the case of the printer 1, 1A. The installation members 12*a*, 12*b* and 12*a*A, 12*b*A are separate from the support members 2, 2A. As a result, the installation members 12*a*, 12*b* and 12*a*A, 12*b*A for installing an accessory device (in this example, an AC adapter 13, 13A) can be used on different printer models irrespective of the external appearance (shape) of the printer 1, 1A. Furthermore, because the AC adapter 13, 13A is attached by the installation members 12*a*, 12*b* and 12*a*A, 12*b*A, an opening can be provided in the bottom of the printer 1, 1A (electronic device) and heat can be dissipated easily therefrom.

A first embodiment and a second embodiment of the invention are described below.

Embodiment 1

FIG. 1 is an external oblique view of a first embodiment of a printer according to the invention.

The printer 1 in this example is a receipt printer used at a checkout counter in a store, for example, uses roll paper (not shown in the figure) as the print medium, and prints by a thermal printing method.

Case members of the printer 1 are described first with reference to FIG. 1.

As shown in FIG. 1, the printer 1 has an outside case 7 surrounding the printer 1 and including a top case member (cutter cover 7*e*, printer cover 7*a*) covering the top, a back case member 7*b* covering the back, a side case member 7*c* covering the sides, and a front case member 7*d* covering the front. The printer 1 also has a support member 2 supporting the printer 1, a paper exit 15 from which the print medium (roll paper) is discharged, a cover release button 3 for opening the printer cover 7*a*, and a power switch 11 for turning the printer power on and off.

As shown in FIG. 1, the top case includes the printer cover 7*a* and cutter cover 7*e*. When the cover release button 3 is pressed, the lock of the printer cover 7*a* disengages, the printer cover 7*a* opens, and the roll paper compartment (not shown in the figure) where roll paper is held opens. This enables easily installing and replacing the roll paper.

Also not shown in the figures, inside the printer cover 7*a* are disposed a platen roller and a printhead (not shown in the figure) at a position opposite the platen roller. The roll paper passes between the platen roller and printhead, and while not shown in the figures, the platen roller is turned by a motor to convey the roll paper from the roll paper compartment to the paper exit 15. After content is printed on the roll paper by the printhead, the roll paper (receipt) is cut by an automatic cutter (not shown in the figure) disposed inside the cutter cover 7*e* and discharged from the paper exit 15.

The printer 1 configured as described above is attached to the bottom section 4 (the part forming the bottom surface of the printer 1 when in use) of the printer 1 case, and is characterized by the configuration of the support member 2 and installation member 12 as described below.

Figure 2:
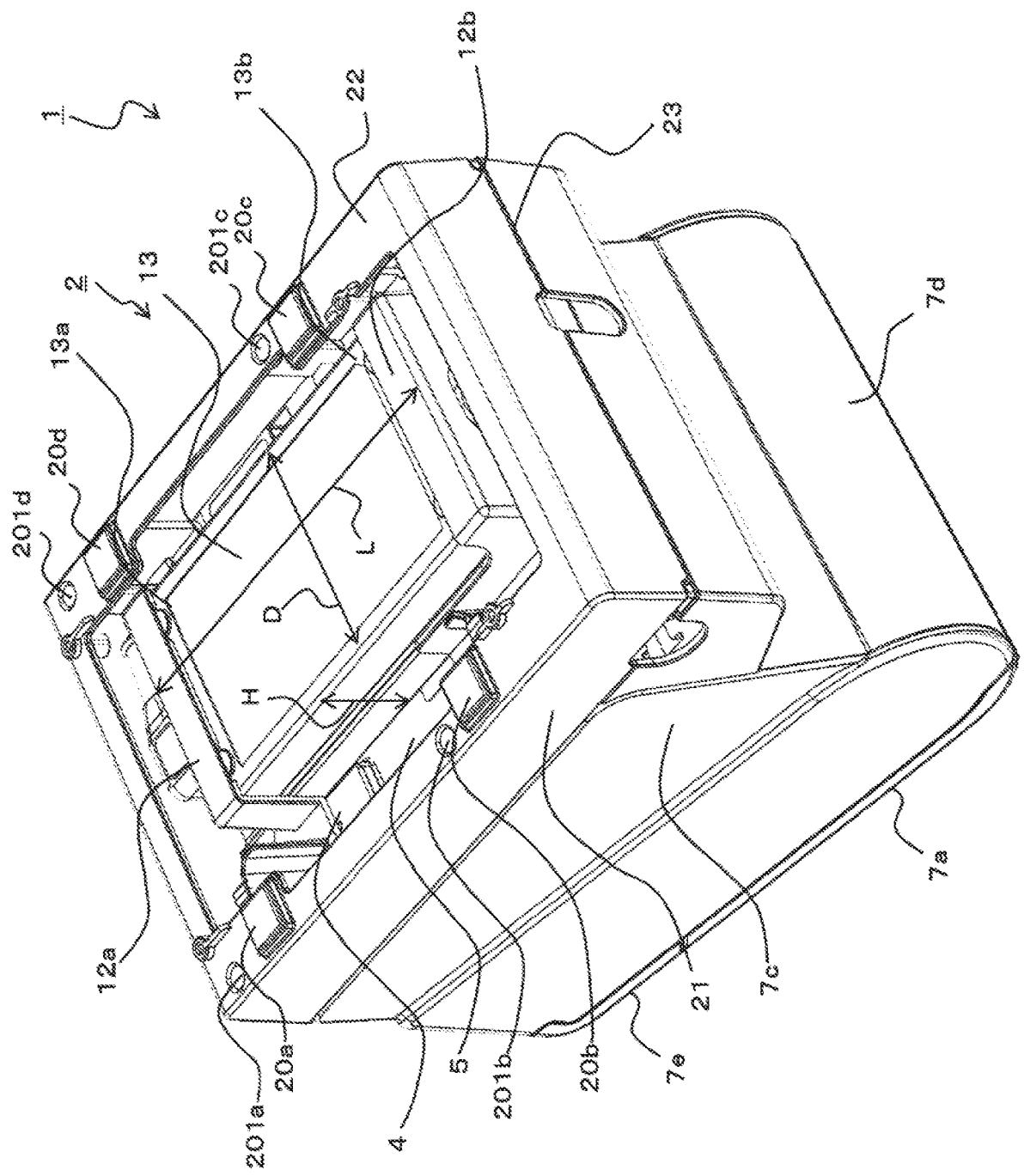
FIG. 2 is an oblique view from the bottom section 4 of the printer 1.

FIG. 2 is an oblique view from the bottom section 4 of the printer.

As shown in FIG. 2, the printer 1 is constructed so that the AC adapter 13, as an example of an accessory device, is installed to the bottom section 4. The AC adapter 13 is attached to the bottom section 4 of the printer 1 by installation members 12*a*, 12*b*. The installation member 12 comprises two installation members 12*a*, 12*b*. The printer 1 in this example has a support member 2 that supports the printer case on the bottom section 4, and the installation members 12*a*, 12*b* to which the AC adapter 13 attaches, and the support member 2 supporting the printer 1, are configured separately from each other.

Figure 4:
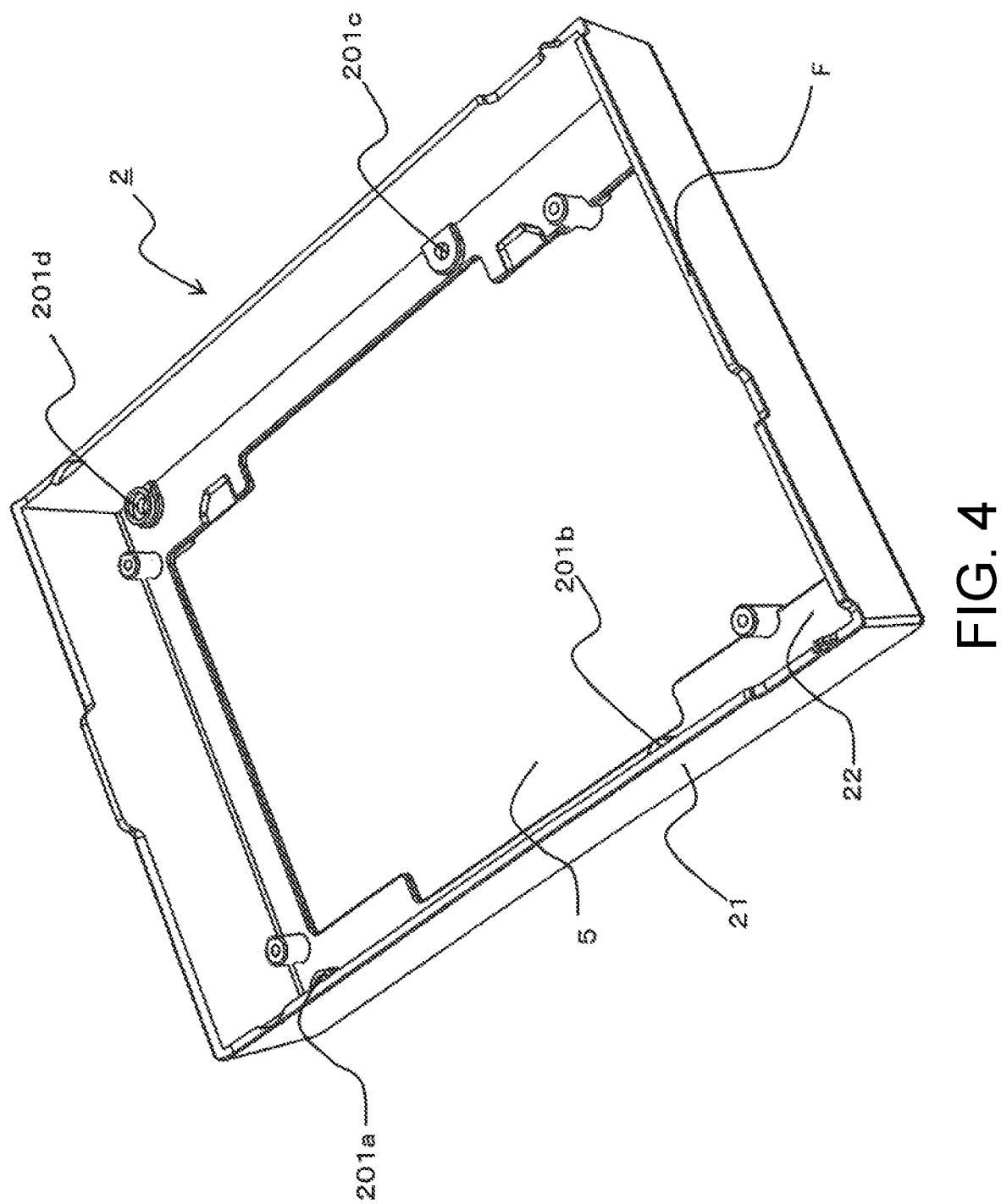
FIG. 4 shows an example of a support member 2.

As described above, the AC adapter 13 is attached by the installation members 12*a*, 12*b*. As a result, the support member 2 that supports the printer 1 does not need strength sufficient to install the AC adapter 13. The support member 2 can therefore be reduced to a basic frame-shaped configuration such as shown in FIG. 4. As shown in FIG. 2, a large opening 5 can be formed in the bottom section 4 of the printer 1.

As shown in FIG. 2, the support member 2 has four protrusions (20*a*, 20*b*, 20*c*, 20*d*) which contact the surface (referred to as the installation surface) on which the printer 1 is placed when in use as shown in FIG. 1. The support member 2 supports the printer 1 on the installation surface through the protrusions (20*a*, 20*b*, 20*c*, 20*d*). The support member 2 is described further below.

The installation members 12*a*, 12*b* of the AC adapter 13, which are a feature of the invention, are described first.

Figure 3:
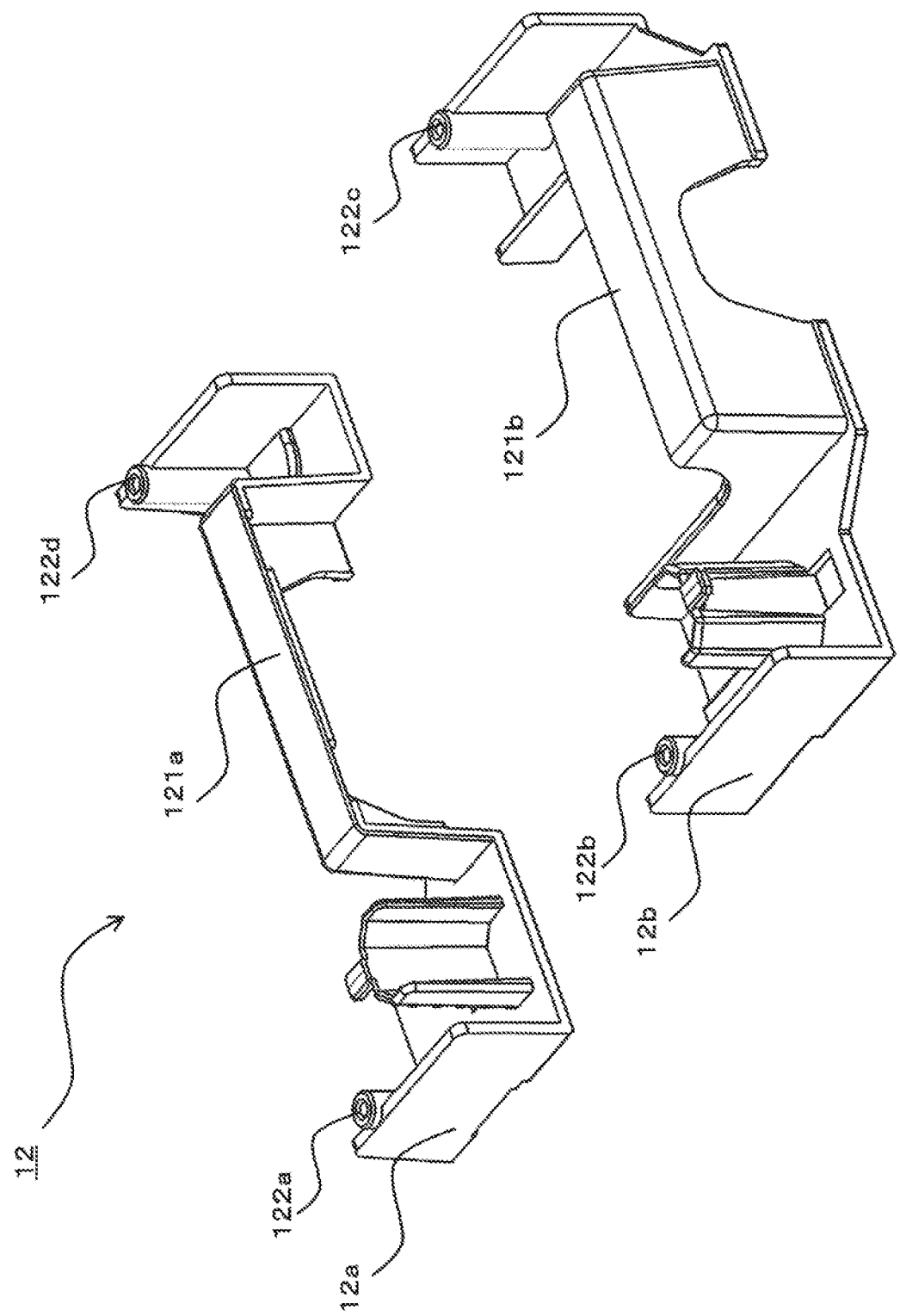
FIG. 3 is an oblique view illustrating the installation member 12 of the AC adapter 13.

FIG. 3 is an oblique view of an exemplary installation member 12 for the AC adapter 13. As described above, the installation members 12*a*, 12*b* are members for attaching the AC adapter 13 to the bottom section 4 of the printer 1. The installation members 12*a*, 12*b* are discrete from the support member 2, and are removable from the support member 2.

The installation members 12*a*, 12*b* are shaped so that the basically rectangular AC adapter 13 can be fastened at the ends 13*a*, 13*b* (see FIG. 2) of the length L. Frames 121*a*, 121*b* of the installation members 12*a*, 12*b* are sized according to the width D and height H of the AC adapter 13, and are shaped so that the AC adapter 13 can be fit thereinside. The installation member 12 in this example comprises two members 12*a*, 12*b*, which are both substantially the same size and shape. The AC adapter 13 is installed by fitting the ends 13*a*, 13*b* into the frames 121*a*, 121*b* of the installation members 12*a*, 12*b*. The AC adapter 13 and installation members 12*a*, 12*b* are fastened to the bottom section 4 of the printer 1 by screws (100*a*, 100*b*, 100*c*, 100*d*) (see FIG. 6) passing through screw holes 122*a*, 122*b*, 122*c*, 122*d* formed near the frame 121*a* of installation member 12*a*, and the frame 121*b* of installation member 12*b*. The installation member 12 may also be configured from one or three or more parts instead of two such as installation members 12*a*, 12*b*. The multiple installation members 12*a*, 12*b* may also be identically shaped.

As described above, the installation members 12*a*, 12*b* and support member 2 are configured discretely, and are separate from each other. The support member 2, which is discrete from the installation member 12, is described further below.

FIG. 4 shows an example of the support member 2.

The support member 2 has side walls 21 and a bottom 22. The side walls 21 extend from a top 23 to the bottom 22. The external dimensions (dimension F of the part that contacts the bottom section 4 of the printer 1) of the support member 2 are substantially the same as the outside dimensions of the bottom section 4 of the printer 1. The support member 2 may be shaped like a frame as shown in FIG. 4. As a result, a large opening 5 can be made in the bottom section 4 of the printer 1 (the part facing the bottom when the printer 1 is installed for use).

When the support member 2 is attached to the bottom section 4, the side walls 21 of the support member 2 surround the bottom section 4 of the printer 1, and the AC adapter 13 installed in the bottom section 4 cannot be seen.

As shown in FIG. 4, four screw holes 201a, 201b, 201c, 201d are formed in the support member 2 at positions corresponding to the screw holes 122a, 122b, 122c, 122d formed in the installation members 12a, 12b as shown in FIG. 3. Screw hole 201d and screw hole screw hole 122a, screw hole 201c and screw hole 122b, screw hole 201b and screw hole 122c, and screw hole 201a and screw hole 122d are respectively disposed to corresponding positions. The installation member 12 and support member 2 are attached to the bottom section 4 of the printer 1 by aligning the screw holes in the installation members 12a, 12b and support member 2 and screwing screws in through the screw holes. When the printer 1 is installed for use, the bottom 22 of the support member 2 contacts the installation surface and supports the printer 1.

The back of the support member 2 is described next.

Figure 5:
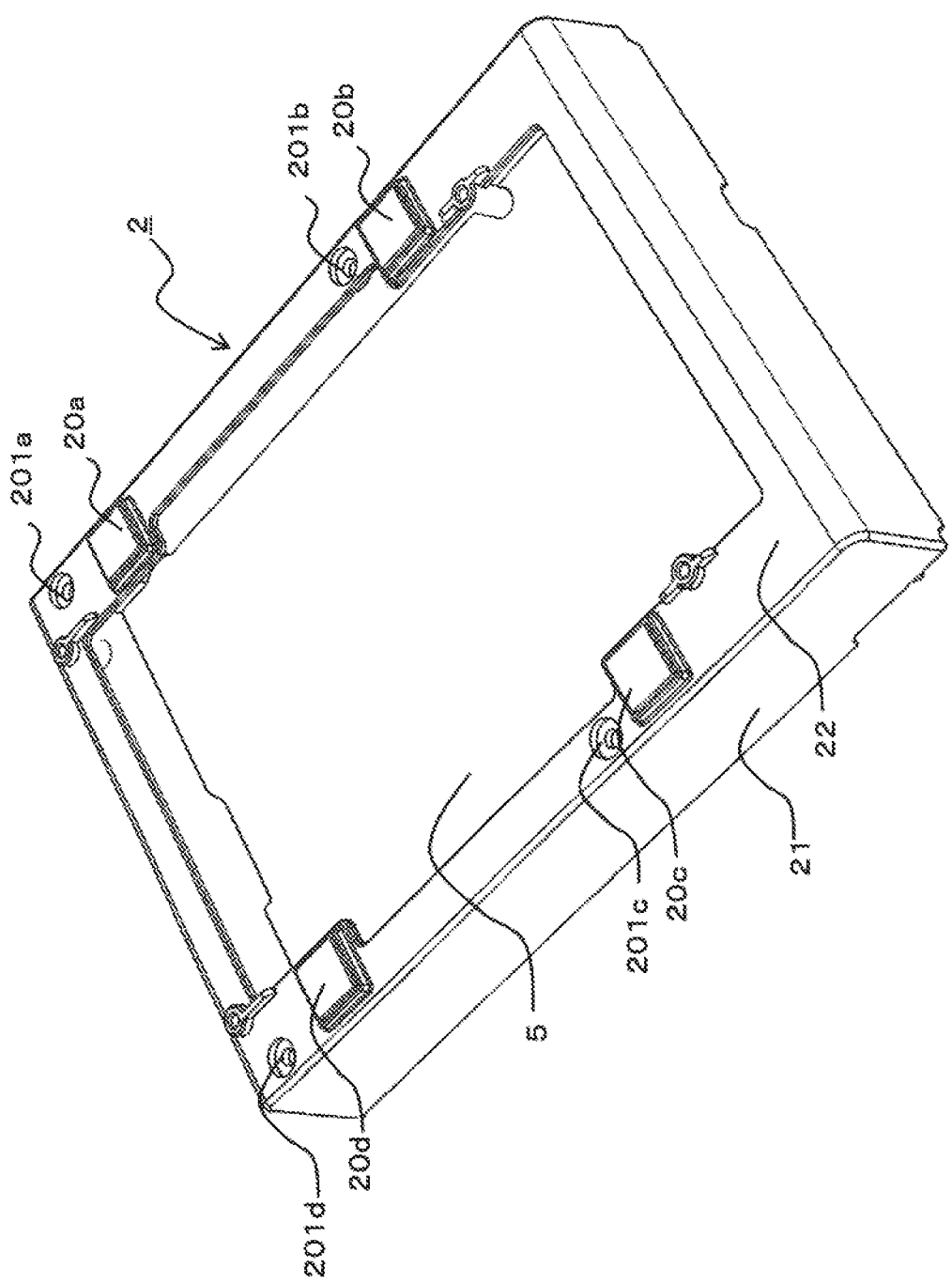
FIG. 5 is an oblique view of the support member 2 from the back.

FIG. 5 is an oblique view of the support member 2 from the back.

Four protrusions (20a, 20b, 20c, 20d) are formed on the bottom 22 of the support member 2. When the printer 1 is in use, the printer 1 is supported by these four protrusions. The screw holes 201a, 201b, 201c, 201d described above are formed near these protrusions, and the support member 2 is attached to the bottom section 4 of the printer 1 by the method described above.

Figure 6:
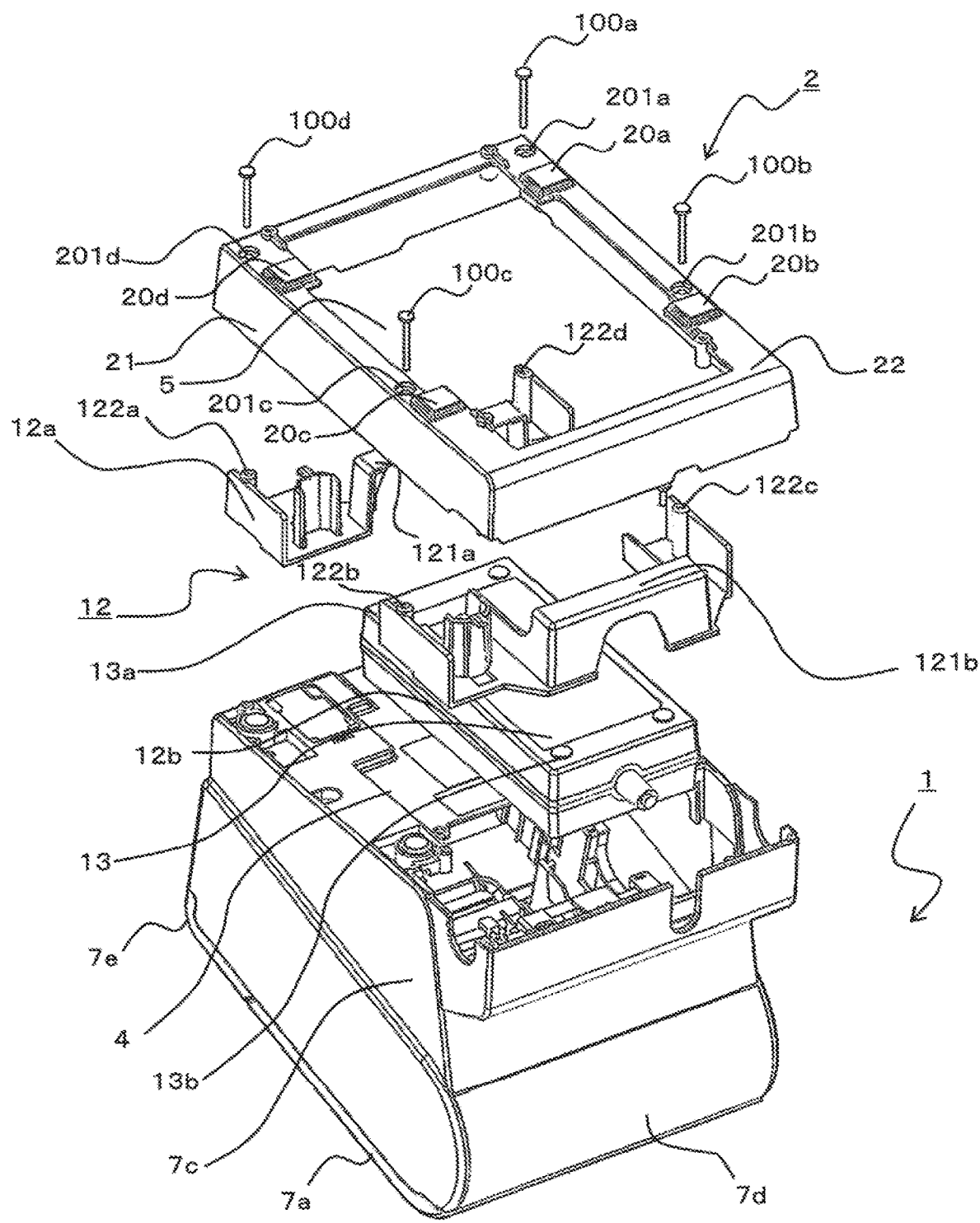
FIG. 6 is an exploded view of the support member 2, installation member 12, and AC adapter 13 before being assembled.

FIG. 6 is an exploded view of the support member 2, installation member 12, and AC adapter 13 before being assembled. As shown in the figure, the support member 2 and installation member 12 are separated. The AC adapter 13 is attached to the bottom section 4 of the printer 1 by the installation members 12a, 12b. The support member 2 and installation members 12a, 12b are attached to the bottom section 4 of the printer 1 by aligning the screw holes 122a, 122b, 122c, 122d in the installation member 12 with the screw holes 201a, 201b, 201c, 201d in the support member 2, and threading screws (100a, 100b, 100c, 100d) through the screw holes. When the printer 1 is in use, the printer 1 is supported by the support member 2.

Embodiment 2

A printer 1A according to the second embodiment of the invention differs from the printer 1 according to the first embodiment of the invention in that the support member 2A of the printer 1A differs from the support member 2 of printer 1. Other parts are the same as in the printer 1 according to the first embodiment. The support member 2A of the second embodiment is described below.

FIG. 7 is an external oblique view of a second embodiment of a printing device according to the invention.

As shown in the figure, the support member 2A has four pedestal members (21aA, 21bA, 21cA, 21dA) that support the printer 1A when the printer 1A is placed for use.

As shown in FIG. 7, because the support member 2A supports the printer 1 with four pedestals as shown, the AC adapter 13 attached to the bottom section 4A of the printer 1A can be seen, unlike with the support member 2 according to the first embodiment of the invention. However, also unlike with the support member 2 according to the first embodiment of the invention, large openings 5A can be formed in the sides of the bottom section 4A of the printer 1A.

Figure 8:
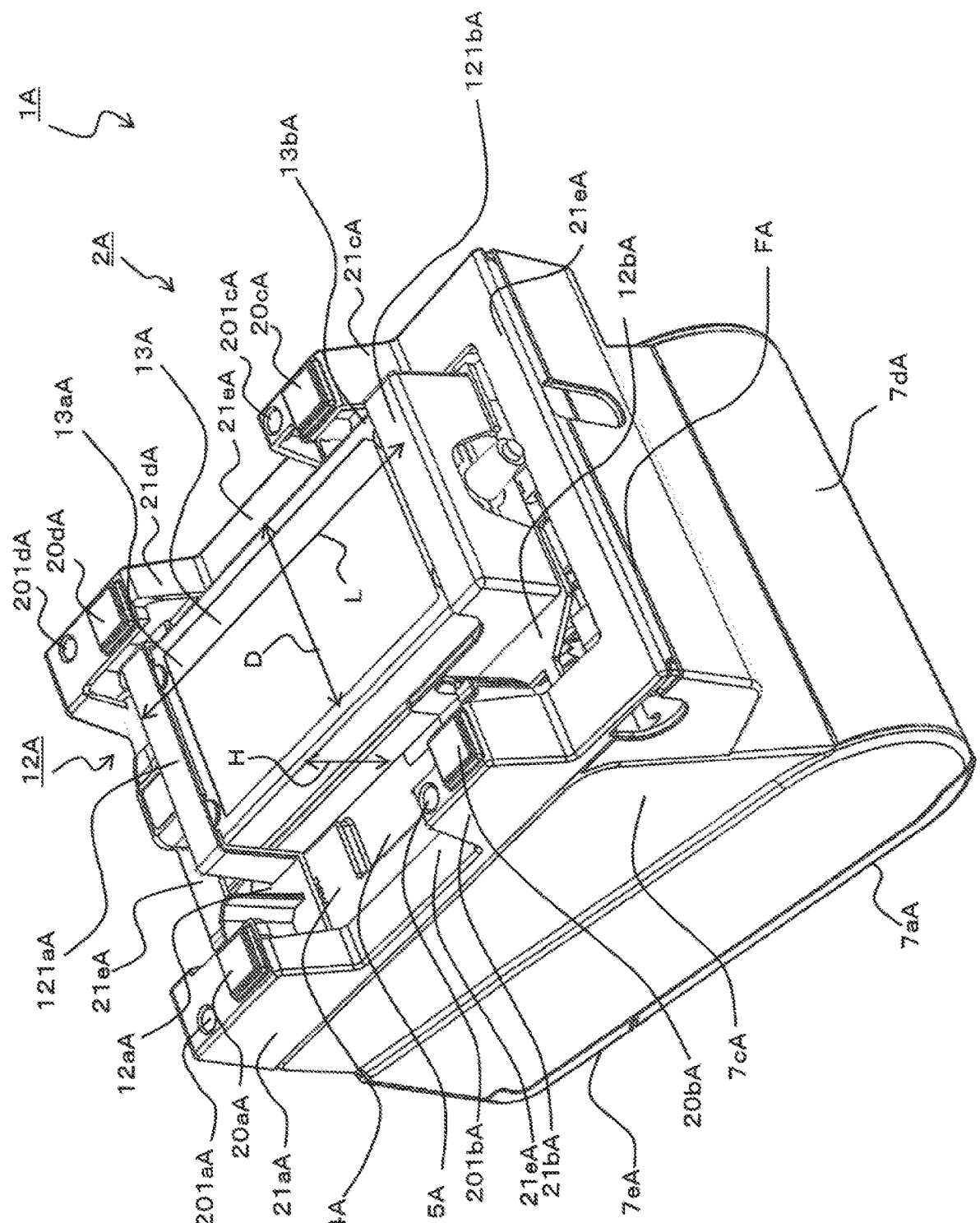
FIG. 8 is an oblique view from the bottom section 4A of the printer 1A.

FIG. 8 is an oblique view of the printer according to this embodiment from the bottom section 4A.

The support member 2A also has a connecting panel 21eA formed between each of the pedestal members (21aA, 21bA, 21cA, 21dA) that form legs supporting the printer 1A. The outside shape of the support member 2A is basically a rectangular frame. As in the first embodiment, the outside dimensions (outside dimension FA of the connecting panels 21eA) of the support member 2A are substantially the same as the outside dimensions of the bottom section 4A of the printer 1A, and when the printer 1A is placed in use, the printer 1A is supported by the protrusions (20aA, 20bA, 20cA, 20dA) disposed to the four pedestal members.

If the pedestal members (21aA, 21bA, 21cA, 21dA) of the support member 2A that supports the printer 1A can support the printer 1A, the number of pedestal members is not limited to four.

As described above, like the printer 1 according to the first embodiment of the invention, this printer 1A is configured with the support member 2A that supports the printer 1A separate from the installation members 12aA, 12aB that attach the AC adapter 13A to the bottom section 4A.

As described above, the first and second embodiments described above have a common effect.

The installation member 12, 12A for installing the AC adapter 13, 13A is configured separately from the support member 2, 2A that supports the printer 1, 1A. As a result, common parts can be shared and used with different models regardless of the outside shape of the printer 1, 1A. The installation member 12, 12A can also be used on various types of electronic devices, not just printers.

Because the AC adapter 13, 13A is installed by an installation member 12, 12A, the support member 2, 2A does not need to be capable of attaching the AC adapter 13, 13A. An opening can therefore be disposed in the bottom of the support member 2, 2A, enabling the easy dissipation of heat.

Because the support member 2 in the first embodiment is disposed so that the AC adapter 13 cannot be seen when the printer 1, 1A is set up for use, a nice appearance is achieved.

Because the printer 1A in the second embodiment is supported by four pedestal members (21aA, 21bA, 21cA, 21dA), space can also be opened in the sides of the bottom section 4A of the printer 1A, and heat dissipation is further improved.

Because the support members 2, 2A are basically frame-shaped members, an opening can also be formed in the bottom. As a result, the printer 1, 1A can be constructed to dissipate heat easily.

Because only the outside dimensions F, Fa of the support members 2, 2A need to adjusted to substantially the same dimensions as the bottom section 4, 4A of the printer 1, 1A, designing the support members 2, 2A is simplified and the appearance is good.

By configuring the installation member 12 from multiple parts, such as installation members 12a, 12b, the parts required to secure the AC adapter 13, 13A can be made small, and the weight of the printer 1, 1A can be reduced.

Furthermore, by configuring the installation members 12, 12A identically, common parts can be shared by different devices.

The printer 1, 1A in the first and second embodiments is a thermal printer, but the invention is not so limited and can be used with printers that print by other printing methods, including inkjet and laser.

Mechanisms of which at least one dimension corresponding to the length L, width D, and height H of the AC adapter 13, 13A can be changed to match the size of the installed AC adapter 13, 13A may be installed in installation members 12a, 12b and 12aA, 12bA.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

The entire disclosure of Japanese Patent Application No. 2016-098477, filed May 17, 2016 is expressly incorporated by reference herein.

What is claimed is:

1. An electronic device comprising:
an installation member configured to attach an accessory device to a bottom of the electronic device; and
a support member configured discretely from the installation member, supporting the electronic device on a surface of the installation member, and opening to the surface of the installation member,
wherein the installation member comprises a first attachment hole and the support member comprises a second attachment hole,
wherein an attachment member extends through the first attachment hole and the second attachment hole to attach the installation member and the support member to the electronic device,
wherein the supporting member comprises a plurality of pedestals and a plurality of protrusions corresponding to the plurality of pedestals,
wherein each of the plurality of pedestals has the second attachment hole through and the protrusion on a surface, and
wherein the accessory device is visible from openings between the plurality of pedestals.

2. The electronic device described in claim 1, wherein:
the support member is configured so that the installed accessory device cannot be seen when the electronic device is installed for use.

3. The electronic device described in claim 1, wherein:
outside dimensions of the support member are substantially the same as outside dimensions of the bottom of the electronic device.

4. The electronic device described in claim 1, wherein:
the installation member is configured from multiple discrete parts.

5. The electronic device described in claim 4, wherein:
the multiple discrete parts of the installation member are identically shaped.

6. A printer comprising:
an installation member configured to attach an accessory device to a bottom of the printer; and
a support member configured discretely from the installation member, supporting the printer on a surface of the installation member, and opening to the surface of the installation member,
wherein the installation member comprises a first attachment hole and the support member comprises a second attachment hole,
wherein an attachment member extends through the first attachment hole and the second attachment hole to attach the installation member and the support member to the printer
wherein the supporting member comprises a plurality of pedestals and a plurality of protrusions corresponding to the plurality of pedestals,
wherein each of the plurality of pedestals has the second attachment hole through and the protrusion on a surface, and
wherein the accessory device is visible from openings between the plurality of pedestals.

* * * * *